United States Patent

Lundy et al.

[11] Patent Number: 6,063,550
[45] Date of Patent: May 16, 2000

[54] AQUEOUS DEVELOPING SOLUTIONS FOR REDUCED DEVELOPER RESIDUE

[75] Inventors: Daniel E. Lundy, Placentia; Robert Barr, Laguna Niguel, both of Calif.

[73] Assignee: Morton International, Inc., Chicago, Ill.

[21] Appl. No.: 09/069,517

[22] Filed: Apr. 29, 1998

[51] Int. Cl.$^7$ ............................................. G03F 7/32
[52] U.S. Cl. ........................................... 430/331; 430/493
[58] Field of Search ..................... 430/331, 493

[56] References Cited

U.S. PATENT DOCUMENTS

| | | | |
|---|---|---|---|
| 4,613,561 | 9/1986 | Lewis ........................ | 430/331 |
| 4,820,621 | 4/1989 | Tanka et al. ................ | 430/331 |
| 4,824,769 | 4/1989 | Lewis et al. ................ | 430/331 |
| 4,914,006 | 4/1990 | Kato et al. ................. | 430/331 |
| 5,030,550 | 7/1991 | Kawabe et al. .............. | 430/326 |
| 5,106,724 | 4/1992 | Nogami et al. .............. | 430/331 |
| 5,122,438 | 6/1992 | Nogami et al. .............. | 430/303 |
| 5,175,078 | 12/1992 | Aoyama et al. ............. | 430/331 |
| 5,217,848 | 6/1993 | Uehara et al. .............. | 430/309 |
| 5,340,703 | 8/1994 | Masumi et al. ............. | 430/389 |
| 5,364,736 | 11/1994 | Eramo, Jr. et al. .......... | 430/280 |
| 5,368,982 | 11/1994 | Suzuki et al. .............. | 430/256 |
| 5,393,643 | 2/1995 | Lundy et al. ............... | 430/281 |
| 5,457,011 | 10/1995 | Lehr et al. ................. | 430/493 |
| 5,532,116 | 7/1996 | Suzuki et al. .............. | 430/331 |
| 5,573,893 | 11/1996 | Fujimoto et al. ........... | 430/493 |
| 5,576,145 | 11/1996 | Keil et al. ................. | 430/281.1 |
| 5,595,860 | 1/1997 | Ishikawa et al. ........... | 430/493 |
| 5,609,991 | 3/1997 | Brigugulio et al. ......... | 430/281.1 |
| 5,731,132 | 3/1998 | Van Werden et al. ....... | 430/331 |
| 5,747,224 | 5/1998 | Sato et al. ................. | 430/331 |

FOREIGN PATENT DOCUMENTS

| | | |
|---|---|---|
| 0 685 767 A1 | 6/1995 | European Pat. Off. . |
| 0 908 785 A2 | 4/1999 | European Pat. Off. . |
| 43 00 576 A1 | 7/1993 | Germany . |
| 63-170640 | 7/1988 | Japan . |
| 031167554 | 7/1991 | Japan . |
| 7-319170 | 12/1995 | Japan . |
| 2 193 335 | 2/1988 | United Kingdom . |

*Primary Examiner*—Hoa Van Le
*Attorney, Agent, or Firm*—Wayne E. Nacker; Gerald K. White

[57] ABSTRACT

An alkaline aqueous developing solution for developing photoresists or the like contains, as an anti-scum agent, an ethoxylated surfactant having the general formula:

$$R\text{—}[O\text{—}(CH_2\text{—}Ch_2\text{—}O)_n]_m\text{—}X \qquad (I)$$

where R is a hydrophobic group, X is H or an anionic group, m is from 1 to 3, and n is at least about 15, preferably at least about 20, more preferably at least about 30.

10 Claims, No Drawings

AQUEOUS DEVELOPING SOLUTIONS FOR REDUCED DEVELOPER RESIDUE

The present invention is directed to alkaline aqueous development solutions such as are used to develop photoresists.

BACKGROUND OF THE INVENTION

In the process of manufacturing printed circuit boards, UV curable photoresist are used. The exposed portion of the photoresist becomes insoluble in developer solution (dilute alkaline solution) and forms a protective barrier to other processing chemicals (for example, etching and plating solutions). The unexposed portion of the photoresist needs to rinse freely from the circuit board with a mild alkaline solution (for example, 1% sodium carbonate, monohydrate in water). The development occurs because the polymer in the photoresist contains acid functionality. These acid groups within the organic polymer matrix are neutralized in alkaline solution forming a water soluble organic salt. As the dissolved photoresist builds up in solution (called developer loading), insoluble organic materials begin to form in the developing tank, eventually forming a water insoluble scum or residue. The presence of anti-foam additives (conventionally added to developing solutions to minimize foaming) greatly increases the tendency for scum to form. As the level of scum builds, chances increase for an inadvertent redeposit of these water insoluble residues onto the developed circuit board. These redeposited residues cause a retardation of the etching solution (etching chemistries have difficulty penetrating any organic residues). Where the etch is retarded, circuit shorts form causing a defective circuit board. In addition to increasing the potential for defective circuit boards, this residue also makes it difficult to clean equipment increasing maintenance time.

Accordingly, it is a primary object of the present invention to provide developing solutions in which the build-up of scum and residue is reduced.

SUMMARY OF THE INVENTION

In accordance with the invention, alkaline aqueous developing solutions, containing between about 0.1 and about 3.0 wt % of a base, are improved by the addition of between about 0.05 and about 1.0 wt % of an ethoxylate compound having the general formula:

$$R-[O-(CH_2-CH_2-O)_n]_m-X \qquad (I)$$

where R is a hydrophobic group, typically a hydrocarbon group, X is H or an anionic group, such as carboxylate, phosphate, or sulfate, m is from 1 to 3, and n is at least about 10, preferably at least about 20, more preferably at least about 30.

Preferably, the developing solution also contains an anti-foam agent, e.g., at between about 0.01 and about 1.0 wt %.

DETAILED DESCRIPTION OF CERTAIN PREFERRED EMBODIMENTS

Aqueous developing solutions to which the present invention generally applies are well known for developing photoresist compositions, both primary photoresists and photoresists which are intended to form hard permanent layers, such as are suitable for solder masks. Examples of such photoresists and the alkaline aqueous development solutions are found, for example, in U.S. Pat. Nos. 5,576,145, 5,609, 991, 5,393,643, and 5,364,736, the teachings of each of which are incorporated herein by reference.

The photoresist compositions vary in composition, but typically such photoresist compositions comprise A) between about 20 and about 80 wt % of a binder polymer having an acid number between about 40 and about 250, B) between about 15 and about 50 wt % of $\alpha,\beta$-ethylenically unsaturated compounds, typically monomers and short-chain oligomers, and C) between about 0.1 and about 25 wt % of a photoinitiator or photoinitiator chemical system, these weight percentages being based on total weight of A) plus B) plus C).

Typically, the alkaline aqueous solution is a solution of sodium carbonate, e.g., 1% sodium carbonate monohydrate. However, other bases, such as NaOH, KOH, triethanolamine, potassium carbonate, etc. may be used to provide the alkalinity necessary for developing photoresists of this type. The alkalinity of the developing solution forms salts with the acid functionality of the binder polymer, typically carboxylic acid functionality, rendering the binder polymer soluble in the alkaline aqueous solution. Thus, photoresists of this type are applied as a layer to a substrate, exposed to patterned actinic radiation, and developed in alkaline aqueous solution which washes away non-exposed, un-polymerized portions of the photoresist layer.

The ethoxylate surfactants used in accordance with the present invention significantly reduce photoresist scum without any reduction in developing performance. To be effective, it is found that the ethoxylate chain of the surfactant should be at least about 10 units long, preferably at least about 20 units long, more preferably at least about 30 units long. Below 10, little if any effect is seen. At lower n values, the scum and residue has been found to actually increase. While an upper limit of ethoxylate chain length has not been determined, it is practical to have ethoxylate chains up to about 150 units long.

The hydrophobic end, i.e., R in the equation (I) above, may almost any hydrocarbon alcohol having a molecular weight of above about 43, including alkyl, alkylaryl, arylalkyl, cycloalkyl alcohols, etc. Alcohols used to form the hydrophobic end include, for example, nonylphenol, octylphenol and tristyrylphenol.

The most effective ethoxylate surfactants for reducing scum and residue are anionic ethoxylate surfactants, e.g., where X is a phosphate (m=1–2). Depending upon the ionic moiety to which the ethoxylate chain is esterified, m may be from 1 to 3. However, the ethoxylate may be non-esterified [X is H, m=1] such that the ethoxylate is non-ionic.

Ethoxylate surfactants in accordance with the invention are sold, for example, under the trademarks Rhodafac and Igepal by Rhône-Poulenc.

Preferably, the alkaline aqueous solution also contains an anti-foam agent, such as that sold as Antifoam 80 by Morton International, Inc.

The invention will now be described in greater detail by way of specific examples:

EXAMPLES 1–6 (1 AND 3 COMPARATIVE)

To a developing solution comprising 1 wt % sodium carbonate monohydrate and 0.05 wt % anti-foam agent were added 0. 1 wt % of various ethoxylate surfactants in accordance with the invention. 200 ml. of each solution were used to develop 0.08 m$^2$ of Morton International G297 photoresist. Scum and other residue was collected by filtration, and the filtrate dried and weighed. Results are shown in Table 1 below:

TABLE 1

| Trade Name | Basic Type | Hydrophilic termini | Hydrophobe | Moles of EO (n) | % Scum change |
|---|---|---|---|---|---|
| 1. Rhodafac PE-510 | anionic | phosphate ester | nonyl-phenol | 6 | 13% Increase |
| 2. Rhodafac RE-960 | anionic | phosphate ester | nonyl-phenol | 50 | 68% Decrease |
| 3. Igepal CO-610 | nonionic | glycol (X = H) | nonyl-phenol | 8 | 5% Increase |
| 4. Igepal CO-850 | nonionic | glycol | nonyl-phenol | 20 | 38% Decrease |
| 5. Igepal CO-887 | nonionic | glycol | nonyl-phenol | 30 | 52% Decrease |
| 6. Igepal CO-997 | nonionic | glycol | nonyl-phenol | 100 | 66% Decrease |

It can be seen that ethoxylated surfactants are effective for scum reduction when the number (n) of ethoxylate units is above 10 and that best results are achieved when (n) is 30 or more.

EXAMPLE 7 AND COMPARATIVE EXAMPLE 8

An ethylene oxide surfactant in accordance with the invention was compared with a propylene oxide surfactant in developing solutions prepared and utilized as per Examples 1–6 above. The results are as per Table 2 below:

TABLE 2

| Trade Name | Basic Type | Hydrophilic termini | Moles of EO | Moles of PO | % Scum Reduction |
|---|---|---|---|---|---|
| 7. Igepal* CO-730 | nonionic | glycol (X = H) | 15 | — | 23% Decrease |
| 8. Macol** RD-216P | nonionic | glycol | — | 16 | 18% Increase |

*hydrophobe = nonylphenol
**hydrophobe = bisphenol A

What is claimed is:

1. An alkaline aqueous developing solution for photoresist consisting essentially of between about 0.1 and about 3.0 wt % of a base, the improvement wherein said developing solution comprises between about 0.05 and about 1.0 wt % of an ethoxylate surfactant having the general formula:

$$R-[O-(CH_2-CH_2-O)_n]_m-PO_4 \qquad (I)$$

where R is a hydrophobic group, m is from 1 to 3, and n is at least about 10.

2. The solution according to claim 1 wherein n is at least about 20.

3. The solution according to claim 1 wherein n is at least about 30.

4. The solution according to claim 1 where m=1–2.

5. The solution according to claim 1 further comprising between about 0.01 and about 1.0 wt % of an anti-foam agent.

6. A method of preparing a patterned photoresist pattern on a substrate comprising providing a layer of a photoresist to a substrate, said photoresist comprising an acid functional binder polymer and photopolymerizable compounds, exposing said layer of photoresist to patterned actinic radiation, and developing said photoresist layer in an alkaline aqueous developing solution consisting essentially of between about 0.1 and about 3.0 wt % of a base, the improvement wherein said developing solution for photoresist comprises between about 0.05 and about 1.0 wt % of an ethoxylate surfactant having the general formula:

$$R-[O-(CH_2-CH_2-O)_n]_m-PO_4 \qquad (I)$$

where R is a hydrophobic group, m is from 1 to 3, and n is at least about 10.

7. The method according to claim 6 wherein n is at least about 20.

8. The method according to claim 6 wherein n is at least about 30.

9. The method according to claim 6 where m=1–2.

10. The method according to claim 6 wherein said developing solution further comprises between about 0.01 and about 1.0 wt % of an anti-foam agent.

* * * * *